United States Patent
Gazit et al.

(10) Patent No.: US 9,424,366 B1
(45) Date of Patent: Aug. 23, 2016

(54) REDUCING POWER CONSUMPTION IN TERNARY CONTENT ADDRESSABLE MEMORY (TCAM)

(71) Applicant: Marvell International Ltd., Hamilton (BM)

(72) Inventors: Hillel Gazit, Palo Alto, CA (US); Sohail Syed, San Jose, CA (US); Gevorg Torjyan, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 138 days.

(21) Appl. No.: 14/167,119

(22) Filed: Jan. 29, 2014

Related U.S. Application Data

(60) Provisional application No. 61/763,193, filed on Feb. 11, 2013.

(51) Int. Cl.
  *G06F 12/00* (2006.01)
  *G06F 17/30* (2006.01)
  *G11C 15/04* (2006.01)

(52) U.S. Cl.
  CPC .......... *G06F 17/30982* (2013.01); *G11C 15/04* (2013.01)

(58) Field of Classification Search
  CPC ... H04L 45/00; H04L 45/745; H04L 45/7457; G06F 12/0864; G06F 12/0895; G06F 17/3033; G06F 17/30982; G06F 2212/1024; G06F 15/7867; G06F 1/035
  USPC ........................................................ 711/104
  See application file for complete search history.

(56) References Cited

U.S. PATENT DOCUMENTS

| | | | |
|---|---|---|---|
| 6,141,743 A | 10/2000 | Strongin | |
| 6,553,453 B1 | 4/2003 | Gibson | |
| 6,760,880 B1 | 7/2004 | Ofek | |
| 6,775,167 B1 | 8/2004 | Avramescu | |
| 6,792,502 B1 | 9/2004 | Pandya | |
| 7,245,623 B1 | 7/2007 | Cheriton | |
| 7,440,460 B2 | 10/2008 | Wybenga | |
| 7,852,850 B2 | 12/2010 | Kopelman et al. | |
| 7,859,877 B2 | 12/2010 | Mondaeev | |
| 7,924,628 B2 | 4/2011 | Danon | |

(Continued)

FOREIGN PATENT DOCUMENTS

WO  WO2006046237 A3   8/2006

OTHER PUBLICATIONS

Dharmapurikar et al., "Longest Prefix Matching using Bloom Filters", SIGCOMM '03, Aug. 25-29, 2003, 12 pages.

(Continued)

*Primary Examiner* — Yong Choe

(57) ABSTRACT

The present disclosure describes systems and techniques relating to accessing data stored in Ternary Content Addressable Memory (TCAM). According to an aspect of the described systems and techniques, a device includes: several blocks of TCAM (Ternary Content Addressable Memory); a hash RAM (Random Access Memory); and processor electronics configured to pre-process control records to (i) identify a subset of bits of the control records, giving priority to bits with no X value, (ii) load the hash RAM based on the identified subset of the bits to be used for hashing of search records to find locations in the several blocks of TCAM, and (iii) order the control records in the several blocks of TCAM in accordance with the identified subset of the bits.

18 Claims, 3 Drawing Sheets

(56) References Cited

U.S. PATENT DOCUMENTS

| | | | |
|---|---|---|---|
| 7,978,700 | B2 | 7/2011 | Kopelman et al. |
| RE43,359 | E | 5/2012 | Avramescu |
| 8,719,917 | B1 | 5/2014 | Ammundi |
| 2004/0003170 | A1 | 1/2004 | Gibson |
| 2007/0115986 | A1* | 5/2007 | Shankara ............... 370/392 |
| 2008/0263269 | A1 | 10/2008 | Kadosh |
| 2009/0043956 | A1 | 2/2009 | Ford |
| 2009/0207946 | A1 | 8/2009 | Sebeni |
| 2010/0205364 | A1* | 8/2010 | Gazit ............... 711/108 |
| 2012/0137060 | A1 | 5/2012 | Akerib |
| 2013/0034100 | A1* | 2/2013 | Goyal et al. ............ 370/392 |
| 2014/0122791 | A1* | 5/2014 | Fingerhut et al. ......... 711/108 |

OTHER PUBLICATIONS

Dharmapurikar et al., "Fast Packet Classification Using Bloom filters", ANCS '06, Dec. 3-5, 2006, 10 pages.

"Content-addressable memory," Wikipedia, the free encyclopedia, http://en.wikipedia.org/wiki/Content-addressable_memory, downloaded Aug. 28, 2013, 4 pages.

Arsovski et al., A Ternary Content-Addressable Memory (TCAM) Based on 4T Static Storage and Including a Current-Race Sensing Scheme, IEEE Journal of Solid-State Circuits, vol. 38, No. 1, Jan. 2003, pp. 155-158.

"Multimap," Wikipedia, the free encyclopedia, http://en.wikipedia.org/wiki/Multihash, downloaded Oct. 18, 2013, 2 pages.

"Hash table," Wikipedia the free encyclopedia, http://en.wikipedia.org/wiki/Hash_table, downloaded Oct. 18, 2013, 14 pages.

"Bloom filter," Wikipedia, the free encyclopedia, http://en.wikipedia.org/wiki/Bloom_filter, downloaded Oct. 18, 2013, 10 pages.

"Associative array," Wikipedia, the free encyclopedia, http://en.wkipedia.org/wiki/Associative_array, downloaded Oct. 18, 2013, 4 pages.

Lim et al., "On Adding Bloom Filters to Longest Prefix Matching Algorithms," IEEE Transactions on Computers, vol. 63, No. 2, Feb. 2014, pp. 411-423.

Agrawal et al., "Modeling TCAM Power for Next Generation Network Devices," In Procedings of IEEE International Symposium on Performance Analysis of Systems and Software (ISPASS-2006), 10 pages, Mar. 19-21, 2006.

* cited by examiner

REDUCING POWER CONSUMPTION IN TERNARY CONTENT ADDRESSABLE MEMORY (TCAM)

CROSS REFERENCE TO RELATED APPLICATIONS

This application claims the benefit of the priority under 35 U.S.C. §119(e) from U.S. Provisional Application Ser. No. 61/763,193, filed Feb. 11, 2013 and entitled "REDUCE POWER CONSUMPTION IN TCAM USING BLOOM FILTERS", which is hereby incorporated by reference.

BACKGROUND

The present disclosure describes systems and techniques relating to accessing data stored in Ternary Content Addressable Memory (TCAM).

TCAM is content addressable memory that can represent three different states: 1, 0, and X, where an X bit indicates a "don't care" with respect to the input bit being a one or a zero. TCAM is often used in network processing devices, such as routers and switches, to assist in rapidly identifying matching rule(s) for an inbound network packet. Such TCAM includes cell based TCAM and algorithmic TCAM.

SUMMARY

The present disclosure describes systems and techniques relating to accessing data stored in TCAM. According to an aspect of the described systems and techniques, a device includes: several blocks of TCAM (Ternary Content Addressable Memory); a hash RAM (Random Access Memory); and processor electronics configured to pre-process control records to (i) identify a subset of bits of the control records, giving priority to bits with no X value, (ii) load the hash RAM based on the identified subset of the bits to be used for hashing of search records to find locations in the several blocks of TCAM, and (iii) order the control records in the several blocks of TCAM in accordance with the identified subset of the bits.

In some cases, every hash value can indicate only one of the several blocks of TCAM. In some cases, a hash function can activate several blocks of the TCAM at once.

The processor electronics can be configured to: identify a first subset of n bits, giving priority to bits with no X value, for hashing to $k=2^{**}n$ control records of a TCAM; and identify a second subset of m bits, giving priority to bits with no X value, for excluding a check of the TCAM. The device can include a bloom filter composed of the hash RAM having bloom filter values selected in accordance with the identified second subset of m bits. In some implementations, m can be 1, 2, 3 or 4; and the bloom filter values number 4, 4, 8 or 16.

The device can include a programmable bit selector to map the identified second subset of m bits from received search records to address bits of the hash RAM to exclude the check of the TCAM. Each of the several blocks of TCAM can include multiple TCAM arrays. Output of the hash RAM can be used as an array enable input to the TCAM arrays of a TCAM block. Moreover, the TCAM arrays of a TCAM block can include algorithmic TCAM arrays, physical TCAM cell based arrays, or both.

According to another aspect of the described systems and techniques, a method includes: identifying a subset of bits of control records to be loaded into several blocks of TCAM (Ternary Content Addressable Memory), wherein the identifying includes giving priority to bits with no X value; ordering the control records in the several blocks of TCAM in accordance with the identified subset of the bits; and loading a hash RAM (Random Access Memory) based on the identified subset of the bits to be used for hashing of search records to find locations in the several blocks of TCAM.

Every hash value can indicate a single one of the several blocks of TCAM. Identifying the subset of bits can include: identifying a first subset of n bits, giving priority to bits with no X value, for hashing to $k=2^{**}n$ control records of a TCAM; and identifying a second subset of m bits, giving priority to bits with no X value, for excluding a check of the TCAM.

The method can include selecting bloom filter values in the hash RAM in accordance with the identified second subset of m bits. The value of m can be 1, 2, 3 or 4, and the bloom filter values can number 4, 4, 8 or 16.

The method can include using a programmable bit selector to map the identified second subset of m bits from received search records to address bits of the hash RAM to exclude the check of the TCAM. Each of the several blocks of TCAM can include multiple TCAM arrays. The method can include using output of the hash RAM as an array enable input to the TCAM arrays of a TCAM block. In addition, the TCAM arrays of a TCAM block can include algorithmic TCAM arrays, physical TCAM cell based arrays, or both.

The described systems and techniques can be implemented in electronic circuitry, computer hardware, firmware, software, or in combinations of them, such as the structural means disclosed in this specification and structural equivalents thereof. This can include at least one computer-readable medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

For example, the disclosed embodiments below can be implemented in various systems and apparatus, including, but not limited to, a special purpose data processing apparatus (e.g., a wireless access point, a remote environment monitor, a router, a switch, a computer system component, a medium access unit), a mobile data processing apparatus (e.g., a wireless client, a cellular telephone, a personal digital assistant (PDA), a mobile computer, a digital camera), a general purpose data processing apparatus (e.g., a minicomputer, a server, a mainframe, a supercomputer), or combinations of these.

The described systems and techniques can result in reduced dynamic power consumption for a device employing TCAM to look up records. For example, in many cases the data RAMs making up an algorithmic TCAM device need not be searched as often, thus saving dynamic power consumption in the device. This can have even further significance as the clock speed of the device increases, e.g., to hundreds of megahertz, or gigahertz speeds. Moreover, by selecting a small number (e.g., 2-4) of data bits (which are all non-X in the control records) to control search exclusions in Bloom filter implementations, the excluded TCAMs can be rapidly determined and turned off for each input search key. Moreover, the system can also be used in implementations with cell based legacy TCAM, where every block of the cell based TCAM can have its own filter that can cause its respective block to "do nothing" for one cycle so as to reduce power consumption.

In addition, it should be noted that unlike bloom filter applications where there is substantial effort to reduce the "false positive" probability because the checking is expensive (in terms of time, power, or both), some implementations can employ checking that is significantly more efficient. For example, a single hash function can be expressed as a table so as to make the filter much less expensive, and the bloom filter (in the sense of having false positives) can be added onto this single hash function, and so the false positive probability need not be substantially minimized. In general, a hash chooses a subset of records and several bits for a filter. Based on the values of those bits, a decision is made whether or not to search the subset of the records. Note that this subset of records (e.g., in the case of legacy cell based TCAM) can be as big as the all set.

The goal can be to look for bits with few possible value combination, e.g., when using two bits, and all records in a subset have 0,0 in those bits, then the search can be stopped in that subset if those bits are not 0,0. Of course, if one record in the subset has X,X in those bits then the subset of records should be searched if the hash picks it. In general, any number of bits can be used, provided the implementation makes it appropriate to pay a price of 2**number_of_bits_used bits of RAM per hash value. Note that the appropriate choice for the number of bits of the input on which to run the hash and the number of bloom filter values to select will likely depend on the given implementation since the appropriate selections here will likely be data and/or TCAM dependent. Moreover, in some implementations, the bloom bits can be the same bits for all entries that use the same hash function, such that mapping of the hash function does not depend on the bloom bits. On the other hand, in some implementations, different bloom bits can be had for different hash values, which can take more resources to save the bit number and fetch the bits, but also allows tailoring of the hash function for specific hash value(s).

Details of one or more implementations are set forth in the accompanying drawings and the description below. Other features and advantages may be apparent from the description and drawings, and from the claims.

DRAWING DESCRIPTIONS

DETAILED DESCRIPTION

Figure 1:
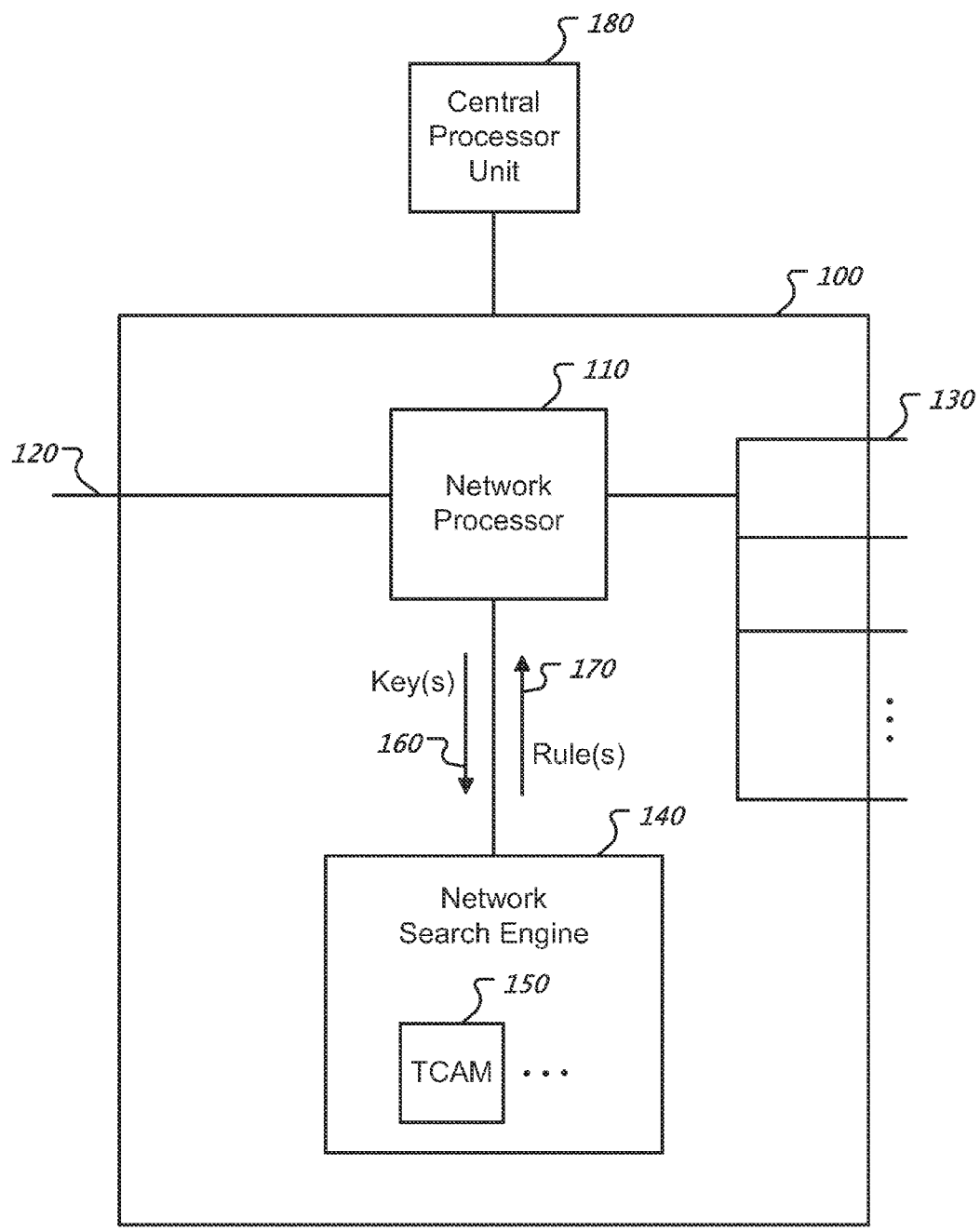
FIG. 1 shows an example of a network device.

FIG. 1 shows an example of a network device 100. The network device 100 can be one or more integrated circuit (IC) devices, a larger device, such as a router or switch, or a combination of these. In some implementations, the network device 100 is coupled with a central processing unit (CPU) 180 of a network communications apparatus. In some implementations, the network device 100 is a network communications apparatus and includes the CPU 180. The network device 100 can be coupled with a computer network, such as a local area network (LAN) or a wide area network (WAN), and processes packet information.

The network device 100 includes a network processor device 110, which receives packets or portions of packets on an input port or interface 120. The network processor 110 can parse incoming packet information to identify relevant fields for handling network operations, such as routing and forwarding. The network processor 110 can be coupled with a network search engine 140, which can assist in determining appropriate actions to take for respective packets. Key information 160 extracted from the packet information, such as network addresses or portions thereof, port numbers, other header and trailer information, or combinations thereof, can be sent to the network search engine 140, which stores rules associated with such key information.

The network search engine 140 can return rules 170 corresponding to the keys 160. The network processor 110 can determine actions to take based on the rules 170 received. Such actions can include outputting a packet on a selected output port or interface 130 or dropping a packet, as appropriate. For additional details regarding network processor operations and structures, see U.S. Pat. No. 7,978,700, which is hereby incorporated by reference.

The network search engine 140 can use one or more memory devices to store rules 170 to be searched, as requested by the network processor 110. The network search engine 140 includes one or more ternary content addressable memories (TCAMs) 150. Moreover, these TCAMs can be cell based or algorithmic in nature. For additional details regarding algorithmic TCAMs, see U.S. Pat. No. 7,852,850, which is hereby incorporated by reference.

Figure 2:
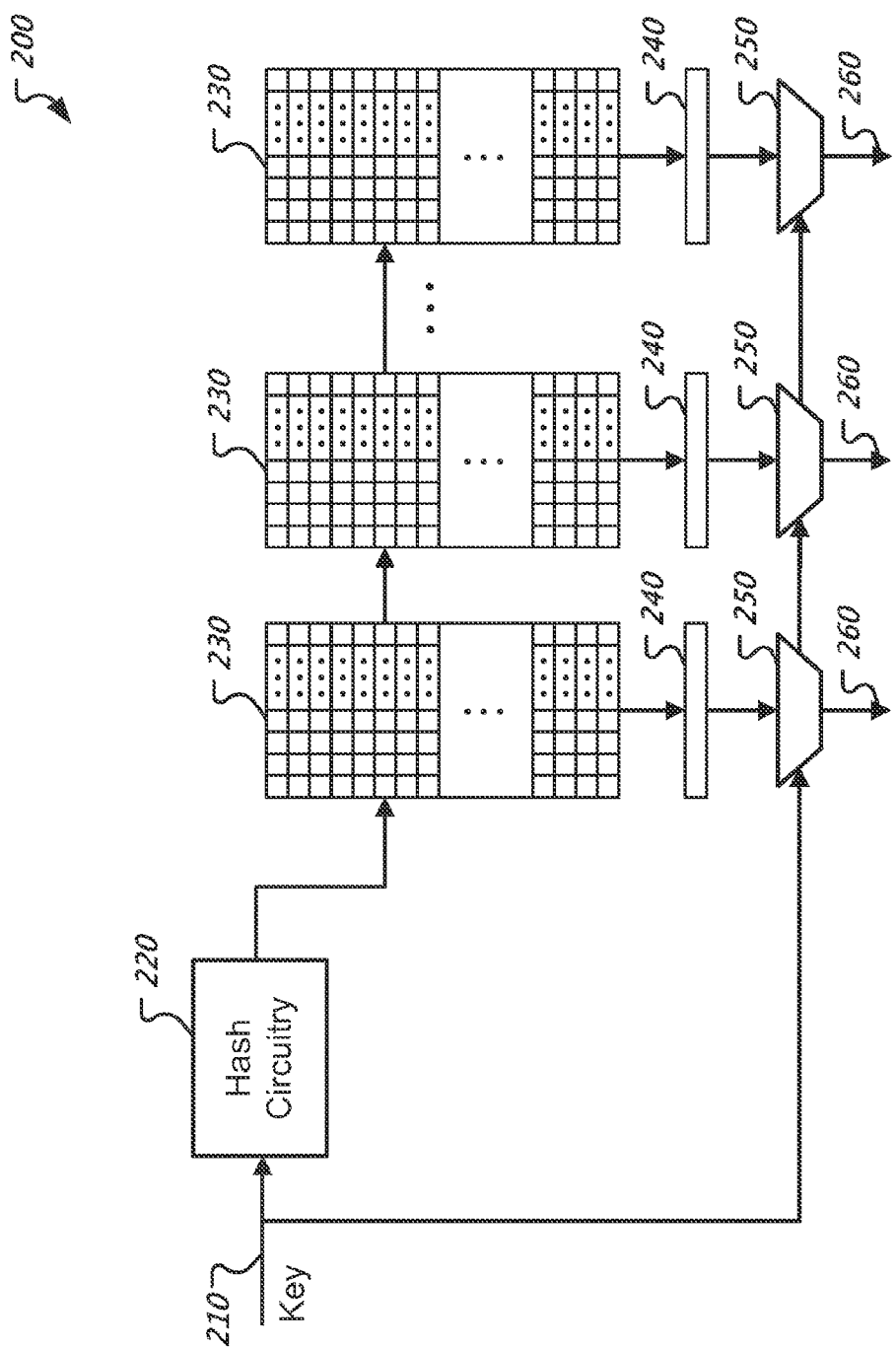
FIG. 2 shows an example of an algorithmic ternary content addressable memory (TCAM).

The description corresponding to FIGS. 1 and 2 focuses on using algorithmic TCAM in the context of processing of network communications. However, the present systems and techniques for reducing power consumption for TCAM search are applicable to cell based TCAM and are also applicable in other data processing contexts.

FIG. 2 shows an example of an algorithmic TCAM 200. In some implementations, the algorithmic TCAM 200 is included in the network search engine 140 of FIG. 1. The algorithmic TCAM 200 includes an input interface 210 on which a search key is received. The search key corresponds to relevant fields identified by a network processor and can include zero (0) bits, one (1) bits, and don't care (X) bits. For example, the search key can include one or more of an internet protocol (IP) address, a socket number, a protocol, a multi-protocol label switching (MPLS) label, or virtual routing and forwarding (VRF) data.

The search key is processed by hash circuitry 220 to generate one or more line identifiers. The hash circuitry 220 can employ known systems and techniques to effect an algorithmic TCAM. For example, the hash circuitry 220 can implement the systems and techniques of U.S. Pat. No. 7,852,850. Moreover, FIG. 2 shows a single line identifier that indicates a location in each of multiple memory devices 230. However, in some implementations, only a single memory device 230 is used, where different memory locations or regions of the memory device 230 can be handled differently. In addition, in some implementations, the hash circuitry 220 can generate different line identifiers for different memory devices 230 or different memory locations or regions within one or more memory devices 230.

The memory devices 230 can include RAM of various types, such as Static RAM (SRAM), Dynamic RAM (DRAM), Synchronous DRAM (SDRAM), Flash RAM, etc. For example, each memory device 230 can be a 512×256 RAM. In addition, each memory device 230 can have an associated buffer 240 and comparator 250, where a memory device 230 and its associated buffer 240 and comparator 250 can be viewed as a memory device module. The circuitry of a memory device 230 provides data indicated by a line identifier to the corresponding buffer, and the circuitry of the corresponding comparator 250 determines whether or not there is a match between the buffered data and the search key. These comparison operations can be performed in parallel, and outputs 260 can indicate whether or not a match was found for the search key in each respective memory device 230. For further details regarding TCAM systems and techniques, see U.S. patent application Ser. No. 14/049,781, filed on Oct. 9, 2013, which application is hereby incorporated by reference.

In any case, the control records to be stored in the memory devices 230 can be pre-processed to identify commonality among bit fields of those records, such that the control records can be grouped in the memory devices 230 so as to minimize the number of memory devices 230 (or regions within a memory device 230) that are indicated for search by output of the hash circuitry 220. Nonetheless, even when such groupings are done well (e.g., the output of the hash circuitry 220 indicates that only 1% of all the stored records should be checked against the input key) there can be a substantial number of memory devices 230 (or regions within a memory device 230) that are searched needlessly since the key 210 will not be found in some of the locations indicated by the output of the hash circuitry 220.

Figure 3:
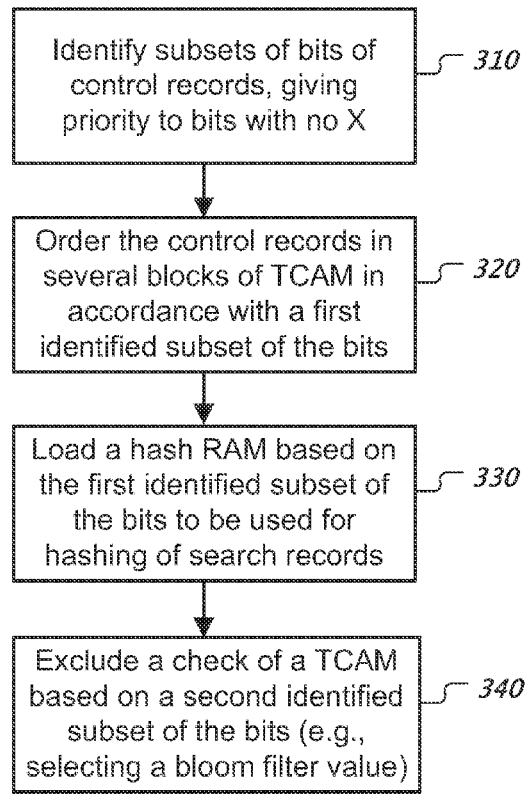
FIG. 3 is a flowchart showing an example of a process of identifying subsets of bits for ordering control records, loading a hash RAM, and excluding a check of a TCAM.

FIG. 3 is a flowchart showing an example of a process of identifying subsets of bits for ordering control records, loading a hash RAM, and excluding a check of a TCAM. At 310, one or more subsets of bits of received control records are identified, giving priority to bits with no X (don't care) values. This can involve identifying a first subset of n bits (giving priority to bits with no X) for hashing to k=2**n control records of a TCAM, and identifying a second subset of m bits (giving priority to bits with no X) for excluding a check of the TCAM.

Note that in the case of TCAM, because of the don't care bits, many hash functions generate too many possible hash values to be practical. The present method tries to reduce the number of bits used for the hash function(s) and give a priority to bits with no X for a subset record. The subsets and the hash function can be built at the same time. As a result, the order of records may be changed.

At 320, the control records are ordered in several blocks of TCAM in accordance with the identified subset of the bits. This can involve ordering the control records based on the first subset of bits, or based on the first and second subsets of bits, as discussed above. In either case, when the order of records is changed, a priority RAM can be used to translate the actual location to the intended location/priority for the control records.

At 330, a hash RAM is loaded based on the identified subset of the bits. This can involve loading the hash RAM based on the first subset of bits addressed above. The hash RAM can be loaded with index values, or index values and bloom filter values, as discussed in further detail below.

The basic hash function can be a subset of bits. Several ways to choose and evaluate those functions can be used. The most primitive function is a table of size equal to the block of TCAM. In other words, if the block has k=2n records, then use n hash bits. The probability of a random record having the same hash value as an arbitrary control record is 1/k. So the probability that a false positive will not happen is 1−1/k. With k such records, the combined probability is (1−1/k)k=1/e, a power saving of 37%. This method has several drawbacks. The main one is the assumption of a random record. Another one is that 37% is pretty low. By using 1 more hash bit, the probability increases to sqrt(1/e). By using n+j hash bits, the probability is (1/e)(1/(2j)), which is thus a better hash function. However, the control records and typical search records may share the same set of hash values.

In some implementation, only one hash function/RAM need be used for several TCAM blocks. There are two flavors of this approach: 1) every hash value can be only in one of the TCAM blocks, and so log of the TCAM count bits is enough for every hash value; and 2) attempt to have every hash value in one, or zero, TCAM blocks, but make no promise of this. Method one saves bits, but if there are too many records with one hash value for one TCAM, some of them may have to be rejected. In addition, at least one TCAM will necessarily be searched. In method, two this will not happen. Both methods have their uses in various implementations.

In some implementations, more hash values can be calculated than strictly needed given the number of lines in the data to be searched. With the same number of data lines, a hash table (e.g., hash RAM) is made bigger, but most of the entries in the hash table will point to nothing because the hash table is much bigger than the number of data lines. Thus, by appropriate ordering of the data in a set of TCAM modules and appropriate filling of an expanded hash table for each TCAM module, one or more checks of the TCAM modules can be excluded (e.g., a hash entry for a given search record points nowhere to indicate that any match in the larger TCAM will not be located in the current TCAM module). This approach may be of particular value in the future if the cost of memory for such expanded hash RAMs goes down further.

In some implementations, Bloom filter values can be determined rather than extra hash values. Such Bloom filter values can also be included in a hash RAM. When a search record comes in and is hashed, the result obtained from the hash RAM can be both an index into the memory portion to be searched for the search record, and also Bloom filter values (e.g., one, two, three or four bits of Bloom for each hash entry). The index indicates that the search record could match the stored control records, but the Bloom filter values can indicate that there cannot be a match, which can terminate the search before it gets started, thus potentially saving dynamic power for the TCAM search that doesn't need to be performed. Recall that Bloom data cannot provide a false negative; only false positives. Thus, if the Bloom values indicate there may be a match, the search of this TCAM will need to proceed, but if the Bloom values indicate there cannot be a match, the search of this TCAM is excluded.

In addition, the Bloom filter values can be connected with the search data of the search record itself by accessing the Bloom filter values according to a function used with the second identified subset of bits of the control records. Thus, at 340, a check of a TCAM can be excluded based on the second identified subset of the bits (e.g., selecting a bloom filter value using data of the search record at the bit position(s) of the second identified subset of the bits). This can facilitate rapid checking of the Bloom filter values and likewise rapid decisions to search or not search a particular TCAM module.

Figure 4:
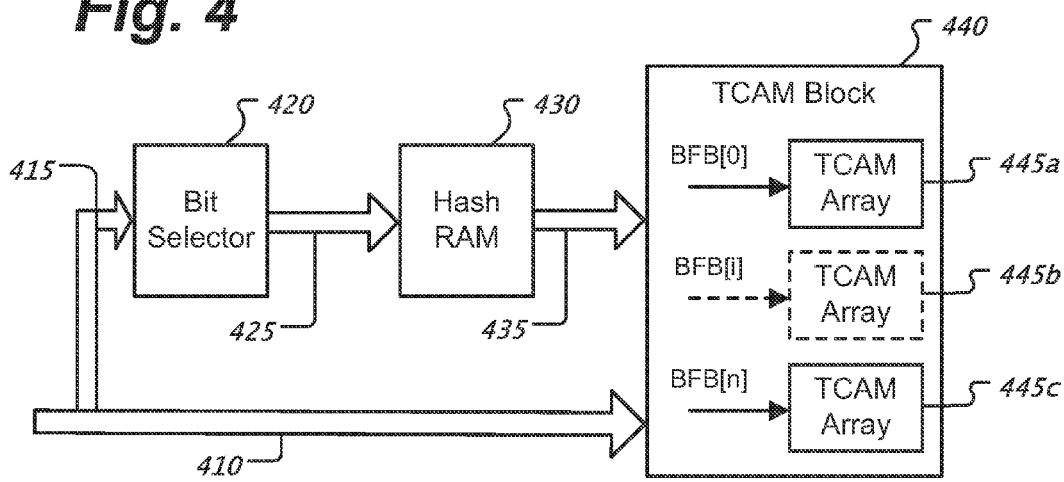
FIG. 4 shows an example of an implementation that uses hash RAM output as array enable to TCAM arrays to exclude one or more TCAM arrays from a search.

FIG. 4 shows an example of an implementation that uses hash RAM output as array enable to TCAM arrays to exclude one or more TCAM arrays from a search. In some implementations, TCAM circuitry can include one or more TCAM blocks 440, where each of the TCAM block(s) 440 can include multiple physical TCAM arrays 445. The TCAM arrays can be concatenated either vertically to form a bigger address space or horizontally for wider key lookup. Moreover, the TCAM arrays 445 can be physical TCAM cell based arrays (circuit based TCAM) or algorithmic TCAM arrays.

An input line 410 provides a search key (e.g., a portion of a search record). A branch line 415 can provide this same search key input to a programmable bit selector 420. The programmable bit selector 420 can map any of the input search key bits to any of address bits of a hash RAM 430. The mapping can be of the identified second subset of m bits to Bloom filter values stored in the hash RAM 430 (e.g., 2 selection bits from the search key to select 4 Bloom filter values). Thus, the programmable bit selector 420 can output a hash address on a line 425 to locate Bloom filter value(s) in the hash RAM 430. Likewise, the hash RAM 430 can output Bloom filter information on a line 435 to exclude one or more searches of the TCAM arrays 445 for the search key. Thus, the Bloom filter being used here can be understood as the combination of the bit selector 420 and the hash RAM 430 storing Bloom filter values.

In some implementations, the RAM output is used as array enable to physical TCAM arrays, so any physical TCAM array can be excluded from the search, reducing total power consumption. As shown in the example in FIG. 4, Bloom Filter Bit (BFB) [0] enables search in a first TCAM array 445a, BFB[i] disables search in a second TCAM array 445b, and BFB[n] enables search in a third TCAM array 445c. Thus, excluding TCAM array 445b can reduce total power consumption to complete the search for the search key. Moreover, in the case of algorithmic TCAM implementations, the Bloom filter can be built on top of the hashing logic of the algorithmic TCAM and utilize most of its logic, such as the programmable bit selector 420 and hash RAM 430. Note that a table can be used to implement a hash function, which provides flexibility in adopting a large number of different possible hash functions, and once such a table-based hash-input-value function has been implemented for hashing operations, additional bits can be readily added to handle BFBs, as described herein.

Note that since the TCAM arrays 445 were previously loaded with known data records, it is straight forward to identify specific data patterns that cannot be matched by any control records in a given TCAM array 445. Thus, when a search key includes such an excluded data pattern (e.g., 2 selected bits from the search key are 01, which cannot match any of the control records in a given TCAM array), the data pattern can be used to access Bloom filter values that rapidly enable or disable one or more appropriate TCAM arrays 445 for the search. As will be appreciated, selecting the appropriate bits for use in the Bloom filter (so as to save dynamic power during searching) can be done by calculating array statistics, both initially for all the control records before loading the TCAM modules of the TCAM device and also once the TCAM modules are loaded but before active searching begins (i.e., as a pre-processing step before the TCAM device goes online to process searches).

A few embodiments have been described in detail above, and various modifications are possible. The disclosed subject matter, including the functional operations described in this specification, can be implemented in electronic circuitry, computer hardware, firmware, software, or in combinations of them, such as the structural means disclosed in this specification and structural equivalents thereof, including potentially a program operable to cause one or more data processing apparatus to perform the operations described (such as a program encoded in a computer-readable medium, which can be a memory device, a storage device, a machine-readable storage substrate, or other physical, machine-readable medium, or a combination of one or more of them).

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A program (also known as a computer program, software, software application, script, or code) can be written in any form of programming language, including compiled or interpreted languages, or declarative or procedural languages, and it can be deployed in any form, including as a stand alone program or as a module, component, subroutine, or other unit suitable for use in a computing environment. A program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A program can be deployed to be executed on one computer or on multiple computers that are located at one site or distributed across multiple sites and interconnected by a communication network.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A device comprising:
several blocks of TCAM (Ternary Content Addressable Memory);
a hash RAM (Random Access Memory); and
processor electronics configured to pre-process control records to (i) identify a subset of bits of the control records, giving priority to bits with no X value, wherein an X value is a don't care state, (ii) load the hash RAM based on the identified subset of the bits to be used for hashing of search records to find locations in the several blocks of TCAM, and (iii) order the control records in the several blocks of TCAM in accordance with the identified subset of the bits.

2. The device of claim 1, wherein every hash value indicates only one of the several blocks of TCAM.

3. The device of claim 1, wherein the processor electronics are configured to:
  identify a first subset of n bits, giving priority to bits with no X value, for hashing to k=2n control records of a TCAM, wherein 2n means 2 to the power of n; and
  identify a second subset of m bits, giving priority to bits with no X value, for excluding a check of the TCAM.

4. The device of claim 3, comprising a bloom filter comprising the hash RANI having bloom filter values selected in accordance with the identified second subset of m bits.

5. The device of claim 3, comprising a programmable bit selector to map the identified second subset of m bits from received search records to address bits of the hash RAM to exclude the check of the TCAM.

6. The device of claim 3, wherein each of the several blocks of TCAM comprises multiple TCAM arrays.

7. The device of claim 6, wherein output of the hash RAM is used as an array enable input to the TCAM arrays of a TCAM block.

8. The device of claim 6, wherein the TCAM arrays of a TCAM block comprise algorithmic TCAM arrays.

9. The device of claim 6, wherein the TCAM arrays of a TCAM block comprise physical TCAM cell based arrays.

10. A method comprising:
  identifying a subset of bits of control records to be loaded into several blocks of TCAM (Ternary Content Addressable Memory), wherein the identifying comprises giving priority to bits with no X value, wherein an X value is a don't care state;
  ordering the control records in the several blocks of TCAM in accordance with the identified subset of the bits; and
  loading a hash RAM (Random Access Memory) based on the identified subset of the bits to be used for hashing of search records to find locations in the several blocks of TCAM.

11. The method of claim 10, wherein every hash value indicates only one of the several blocks of TCAM.

12. The method of claim 10, wherein identifying the subset of bits comprises:
  identifying a first subset of n bits, giving priority to bits with no X value, for hashing to k=2n control records of a TCAM, wherein 2n means 2 to the power of n; and
  identifying a second subset of m bits, giving priority to bits with no X value, for excluding a check of the TCAM.

13. The method of claim 12, comprising selecting bloom filter values in the hash RAM in accordance with the identified second subset of m bits.

14. The method of claim 12, comprising using a programmable bit selector to map the identified second subset of m bits from received search records to address bits of the hash RAM to exclude the check of the TCAM.

15. The method of claim 12, wherein each of the several blocks of TCAM comprises multiple TCAM arrays.

16. The method of claim 15, comprising using output of the hash RAM as an array enable input to the TCAM arrays of a TCAM block.

17. The method of claim 15, wherein the TCAM arrays of a TCAM block comprise algorithmic TCAM arrays.

18. The method of claim 15, wherein the TCAM arrays of a TCAM block comprise physical TCAM cell based arrays.

* * * * *